(12) United States Patent
Zhou et al.

(10) Patent No.: US 7,473,122 B2
(45) Date of Patent: Jan. 6, 2009

(54) ELECTRICAL CONNECTOR HAVING AN IMPROVED PROTECTING MECHANISM

(75) Inventors: Yang Zhou, ShenZhen (CN); Hui Ye, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/151,541

(22) Filed: May 7, 2008

(65) Prior Publication Data

US 2008/0280473 A1 Nov. 13, 2008

(30) Foreign Application Priority Data

May 7, 2007 (TW) .............................. 96207250 U

(51) Int. Cl.
*H01R 4/50* (2006.01)
(52) U.S. Cl. .................................................... 439/342
(58) Field of Classification Search ................. 439/342, 439/259–270
See application file for complete search history.

(56) References Cited

U.S. PATENT DOCUMENTS

| 6,338,640 | B1 * | 1/2002 | Lin ............................. 439/342 |
| 6,609,926 | B1 | 8/2003 | Chen et al. |
| 6,921,276 | B2 * | 7/2005 | McClinton ................... 439/342 |
| 7,052,302 | B2 * | 5/2006 | Lei et al. ..................... 439/342 |
| 7,114,978 | B2 * | 10/2006 | He et al. ...................... 439/342 |

\* cited by examiner

*Primary Examiner*—Briggitte R Hammond
(74) *Attorney, Agent, or Firm*—Wei Te Chung

(57) ABSTRACT

An electrical connector (2) includes a housing (20), a cover (22) slidably covering the housing (20) and a protecting mechanism (24). The protecting mechanism includes a top plate (241), a bottom plate (242) defining a first hole (2441) thereon and a protecting plate (244) having an engaging portion (243) proximate to the inner surface of the first hole. The electrical connector further has an actuator (26) including a head (260) and a cam portion (2622) engaging with the engaging portion.

12 Claims, 4 Drawing Sheets

ELECTRICAL CONNECTOR HAVING AN IMPROVED PROTECTING MECHANISM

BACKGROUND OF THE INVENTION

1. Field of the Invention

The present invention is directed to an electrical connector, and particularly to an electrical connector having an improved protecting mechanism for protecting a cover and a base thereof.

2. Description of Prior Arts

A ZIF (Zero Insertion Force) socket is often used to mount a PGA (Pin Grid Array) chip on to a printed circuit board. U.S. Pat. No. 6,609,926 issued on Aug. 26, 2003 discloses an electrical connector comprising a base defining a depressed portion thereron, an actuator having a head and a plurality of cylindrical portions, a cover slidably engaging on the base by the actuator, a protecting member comprising a cover plate attached to a lower surface of the cover and a bottom plate attached to the depressed portion. The cover defines a corresponding indentation thereon for receiving the head of actuator. The cover plate and the bottom plate respectively has a hole defined on a central portion thereof for mating with the cylindrical portion of the actuator.

In operation, the actuator is rotated to push the cover to slide along the base. One of the cylindrical portions rotatably engages with the inner surface of hole of the bottom plate. Conventionally, the bottom plate is punched by a metal sheet so that the inner surface of the hole is not lubricous enough to engage with the cylindrical portion of the actuator. Therefore, it is difficult to push the actuator, and the stability between the PGA chip and the printed circuit board is easy to be broken.

Hence, it is desirable to provide an improved electrical connector to overcome the aforementioned disadvantages.

SUMMARY OF THE INVENTION

An object of the present invention is to provide an electrical connector having an improved protecting mechanism which has a protecting plate for favorably mating with an actuator.

To achieve the above object, an electrical connector for connecting with a PGA chip, comprises a housing having a plurality of passageways and a first depressed portion defined thereon, a plurality of contacts mounted into the passageways, a cover slidably covering the housing and having a top hole, a plurality of passages in alignment with the passageways of the housing and a protecting mechanism. The protecting mechanism includes a top plate assembled to a bottom portion of the housing, a bottom plate mounted to the first depressed portion of the housing and defined a first hole in a center thereof, and a protecting plate having an engaging portion proximate to the inner surface of the first hole. The electrical connector further has an actuator having a head received in the top hole of the cover and a cam portion engaging with the engaging portion.

Advantages of the present invention are to provide an engaging portion proximate to the inner surface of the first hole of the bottom plate. In operation, the actuator is rotated to push the cover to slide along the housing. The cam portion of the cylindrical member rotatably engages with the engaging portion. That would result in reducing a friction between the cam portion of the actuator and the inner surface of the first hole.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
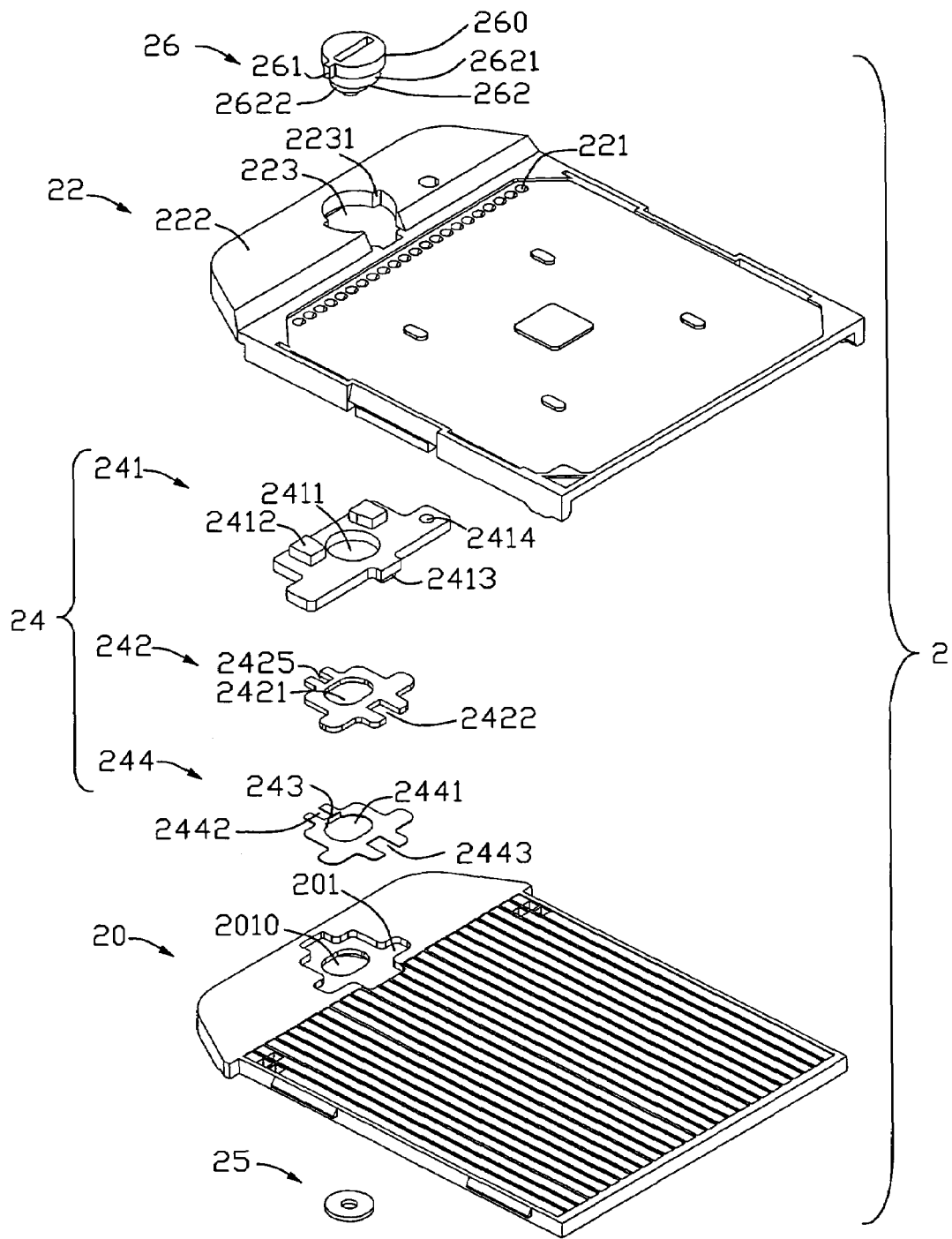
FIG. 1 is an exploded view of an electrical connector of the present invention.
Figure 2:
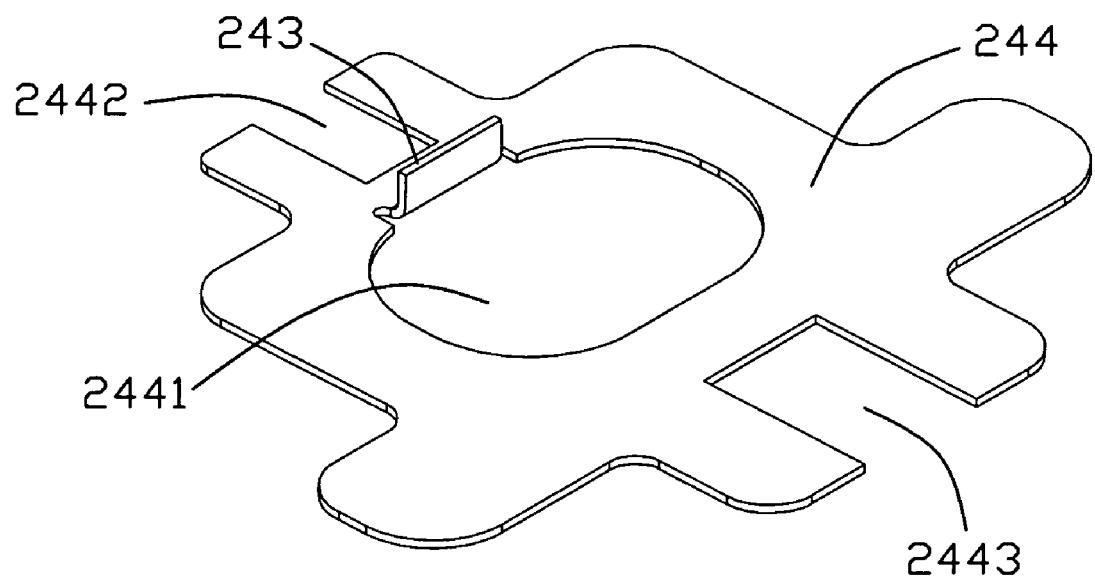
FIG. 2 is a perspective view of a protecting plate as shown in FIG. 1.

Reference will now be made to the drawing figures to describe the present invention in detail. Referring to FIGS. 1-4, an electrical connector 2 assembled a heat sink (not shown) for connecting a PGA chip (not shown) thereto comprises a housing 20 having a plurality of passageways (not labeled) and a plurality of contacts (not shown) mounted into the passageways, a cover 22 slidably mounted on the housing 20, a protecting mechanism 24 located between the housing 20 and the cover 22, and an actuator 26.

Referring to FIG. 1, The housing 20 is of rectangular configuration and has a first depressed portion 201 defined on one end thereof and a circular through hole 2010 defined in a center of the first depressed portion 201.

The cover 22 comprises a plurality of passages (not shown) in alignment with the passageways of the housing 20, a stepped portion 222 formed at one end thereof and a top hole 23 defined in the stepped portion 222, corresponding to the circular through hole 2010 of the housing 20. The top hole 223 has a first semicircular portion, and a second semicircular portion (not labeled) having a radius smaller than a radius of the first semicircular portion. Accordingly, a pair of stop walls 2231 are formed at the inner surface of corresponding junctions between the first semicircular portion and the second semicircular portion.

The protecting mechanism 24 has a substantially T-shaped metal top plate 241, a bottom plate 242 mounted to the first depressed portion 201 of the housing 20 and a protecting plate 244 located between the bottom plate 242 and the housing 20. The top plate 241 is mounted into a second depressed portion (not shown) disposed on a bottom portion of the cover 22 and has a apeture 2411 defined in a central portion thereof.

The top plate 241 has a pair of bulges 2412 projecting upwardly from the top surface thereof. The top plate 241 further comprises a pair of small fixing holes 2414 defined in opposite side portions thereof for mounting the top plate 241 to the second depressed portion, a first guiding block 2413 projecting downwardly from a front edge portion thereof and a second guiding block (not shown) disposed on an end edge portion thereof.

The bottom plate 242 has a first hole 2421 defined in a central portion thereof, a first guiding slot 2422 and a second guiding slot 2425 respectively engaging with the first guiding block 2413 and the second guiding block.

The protecting plate 244 has a second hole 2441 defined in a central portion thereof, a third guiding slot 2443 and a fourth guiding slot 2442, respectively in alignment with the first guiding slot 2422 and the second guiding slot 2425. The protecting plate 244 further has an engaging portion 243 extending upwardly from the inner surface of second hole 2441 and adhered to the inner surface of first hole 2421. In another embodiment, a protecting plate is directly disposed on the inner surface of the first hole 2421 as a whole for engaging with the actuator 26.

The actuator 26 has a head 260 received in the top hole 223 of the cover 22 and a stem 262 having an upper cylindrical portion 2621 and a lower cam portion 2622. The actuator 26 further has a lateral protrusion 261 protruding from a side portion of the head 260 and mating with the stopped wall 2231 for preventing over-rotating between the cover 22 and the housing 20.

Figure 3:
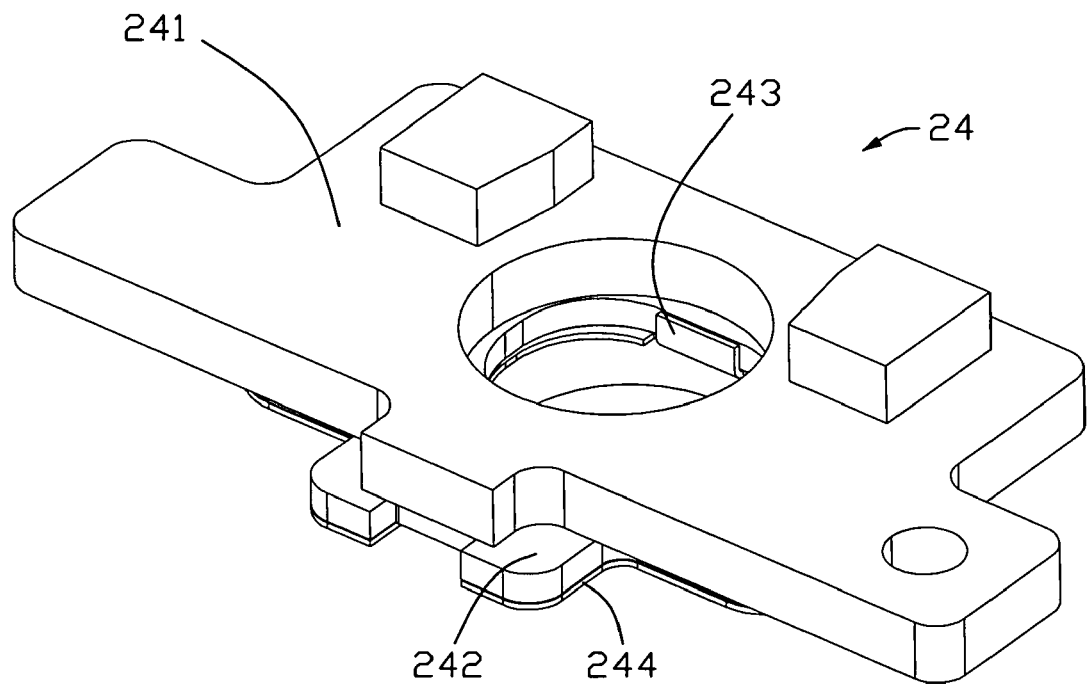
FIG. 3 is an assembled perspective view of a protecting mechanism as shown in FIG. 1.
Figure 4:
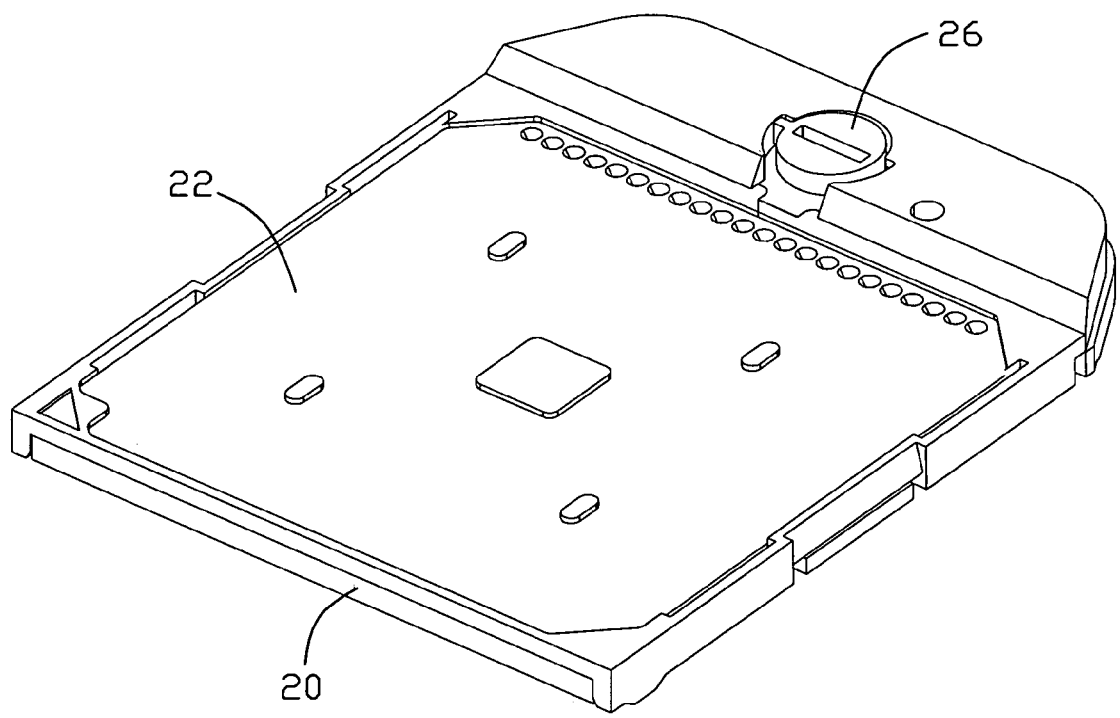
FIG. 4 is an assembled perspective view of the electrical connector as shown in FIG. 1.

Referring to FIGS. 3 and 4, in assembly, firstly, the protecting plate 244 is received in the first depressed portion 201 of the housing 20. The bottom plate 242 is assembled on the protecting plate 244. At this time, the engaging portion 243 is intimately proximate to the inner surface of the first hole 2421. The top plate 241 is assembled to the second depressed portion of the cover 22. Secondly, the stem 262 is inserted through the top hole 223, an aperture 2411 of the top plate 241, the first hole 2421 and the second hole 2441 and finally secured by a locking member 25.

In operation, the actuator 26 is rotated to push the cover 22 to slide along the housing 20. The cam portion 2622 of the stem 262 rotatably engages with the engaging portion 243 of the protecting portion 244. It would reduce the frictional force between the cam portion 2622 and the inner surface of the first hole 2421.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for connecting with a PGA (Pin Grid Array) chip, comprising:
   a housing comprising a plurality of passageways and a first depressed portion defined thereon;
   a plurality of contacts mounted into the passageways;
   a cover slidably covering the housing and comprising a top hole and a plurality of passages in alignment with the passageways of the housing;
   a protecting mechanism comprising a top plate assembled to a bottom portion of the cover, a bottom plate mounted to the first depressed portion of the housing and defining a first hole in a center thereof, and a protecting plate having an engaging portion proximate to the inner surface of the first hole; and
   an actuator having a head received in the top hole of the cover and a cam portion for engaging with the engaging portion.

2. The electrical connector as claimed in claim 1, wherein said protecting plate is located between the bottom plate and the housing.

3. The electrical connector as claimed in claim 2, wherein said protecting plate has a second hole defined in a central portion thereof, and said engaging portion extends upwardly from the inner surface of second hole and adhered to the inner surface of first hole.

4. The electrical connector as claimed in claim 3, wherein said top plate has an aperture, and said actuator has a stem inserted though the aperture, the first hole and the second hole.

5. The electrical connector as claimed in claim 4, wherein said actuator has a gradually decreased diameter from the uppermost one to the lowermost one.

6. The electrical connector as claimed in claim 2, wherein said top plate has a pair of guiding blocks disposed on opposite edges thereof, and said bottom plate comprises a pair of guiding slots engaging with the guiding blocks.

7. The electrical connector as claimed in claim 6, wherein said protecting plate includes a third guiding slot defined on a front side portion thereof and a fourth guiding slot defined on an end portion thereof respectively mating with said guiding blocks.

8. The electrical connector as claimed in claim 1, wherein said top hole of the cover has a first semicircular portion and a second semicircular portion having a radius smaller than a radius of the first semicircular portion.

9. The electrical connector as claimed in claim 8, wherein said cover has a pair of stop walls formed at the inner surface of corresponding junctions between the first semicircular portion and the second semicircular portion.

10. The electrical connector as claimed in claim 9, wherein said actuator has a lateral protrusion protruding from a side portion thereof mating with the stopped wall for preventing the head from over-rotating.

11. An electrical connector comprising:
    a housing comprising a plurality of passageways;
    a plurality of contacts mounted into the passageways;
    a cover slidably covering the housing and comprising a top hole and a plurality of passages in alignment with the passageways of the housing;
    a protecting mechanism comprising a top plate received in the cover, a bottom plate received in the housing and defining a hole; and
    an actuator having a head received in the cover and a cam portion confronting an inner surface of said hole; wherein
    a portion of said inner surface is covered by a protection device to indirectly engage the cam for lubrication purpose.

12. The connector as claimed in claim 11, wherein said protection device is an engaging tab extending from a protection plate under said bottom plate.

* * * * *